(12) United States Patent
Yamada et al.

(10) Patent No.: US 7,989,317 B2
(45) Date of Patent: Aug. 2, 2011

(54) MANUFACTURING METHOD OF SEMICONDUCTOR DEVICE

(75) Inventors: Daiki Yamada, Tochigi (JP); Yoshitaka Dozen, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/909,244

(22) Filed: Oct. 21, 2010

(65) Prior Publication Data
US 2011/0039394 A1    Feb. 17, 2011

Related U.S. Application Data

(62) Division of application No. 11/918,950, filed as application No. PCT/JP2006/310282 on May 17, 2006, now Pat. No. 7,820,526.

(30) Foreign Application Priority Data

May 20, 2005 (JP) ................................ 2005-148405

(51) Int. Cl.
*H01L 21/30* (2006.01)
*H01L 21/46* (2006.01)
(52) U.S. Cl. ................................ 438/458; 257/E23.173
(58) Field of Classification Search .................. 438/458; 257/E23.173
See application file for complete search history.

(56) References Cited

U.S. PATENT DOCUMENTS

| | | | |
|---|---|---|---|
| 5,757,456 A | 5/1998 | Yamazaki et al. |
| 6,118,502 A | 9/2000 | Yamazaki et al. |
| 6,521,511 B1 | 2/2003 | Inoue et al. |
| 6,887,650 B2 | 5/2005 | Shimoda et al. |
| 6,946,361 B2 | 9/2005 | Takayama et al. |
| 6,982,209 B2 | 1/2006 | Chen et al. |
| 7,037,752 B2 | 5/2006 | Kuwabara et al. |
| 7,050,138 B1 | 5/2006 | Yamazaki et al. |
| 7,091,070 B2 | 8/2006 | Imai et al. |
| 7,189,631 B2 | 3/2007 | Yamazaki et al. |
| 7,245,331 B2 | 7/2007 | Yamazaki et al. |
| 7,351,300 B2 | 4/2008 | Takayama et al. |
| 7,361,573 B2 | 4/2008 | Takayama et al. |
| 7,482,248 B2 | 1/2009 | Tamura |

(Continued)

FOREIGN PATENT DOCUMENTS

EP    1 437 683    7/2004

(Continued)

OTHER PUBLICATIONS

International Search Report (Application No. PCT/JP2006/310282) dated Aug. 29, 2006.
Written Opinion (Application No. PCT/JP2006/310282) dated Aug. 29, 2006.

*Primary Examiner* — Jenny L. Wagner
(74) *Attorney, Agent, or Firm* — Eric J. Robinson; Robinson Intellectual Property Law Office, P.C.

(57) ABSTRACT

To provide a manufacturing method of a semiconductor device in which manufacturing cost can be reduced, and a manufacturing method of a semiconductor device with reduced manufacturing time and improved yield. A manufacturing method of a semiconductor device is provided, which includes the steps of forming a first layer containing a metal over a substrate, forming a second layer containing an inorganic material on the first layer, forming a third layer including a thin film transistor on the second layer, irradiating the first layer, the second layer, and the third layer with laser light to form an opening portion through at least the second layer and the third layer.

11 Claims, 12 Drawing Sheets

U.S. PATENT DOCUMENTS

| | | |
|---|---|---|
| 7,516,692 B2 | 4/2009 | Pirkle et al. |
| 7,547,612 B2 | 6/2009 | Yamazaki et al. |
| 2004/0239827 A1* | 12/2004 | Yamazaki et al. .............. 349/45 |
| 2005/0070038 A1 | 3/2005 | Yamazaki et al. |
| 2006/0163710 A1 | 7/2006 | Kuwabara et al. |
| 2006/0270195 A1 | 11/2006 | Yamada et al. |
| 2007/0196999 A1 | 8/2007 | Tamura et al. |

FOREIGN PATENT DOCUMENTS

| | | |
|---|---|---|
| EP | 1 453 086 | 9/2004 |
| EP | 1 455 394 | 9/2004 |
| JP | 2002-026327 | 1/2002 |
| JP | 3406727 | 5/2003 |
| JP | 2006-186347 | 7/2006 |

* cited by examiner

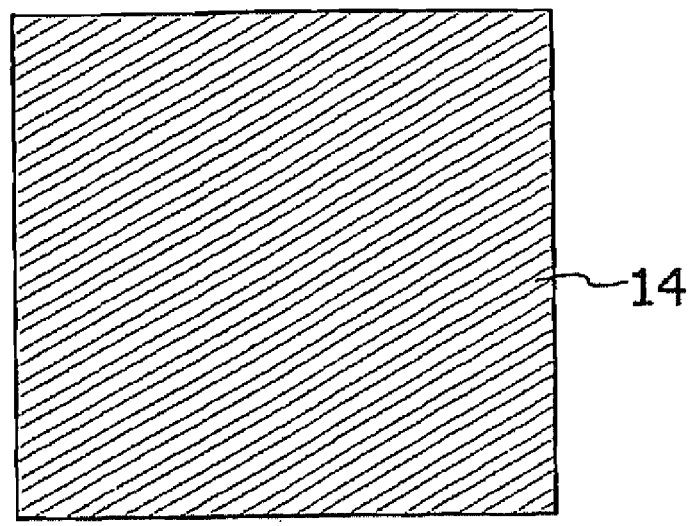
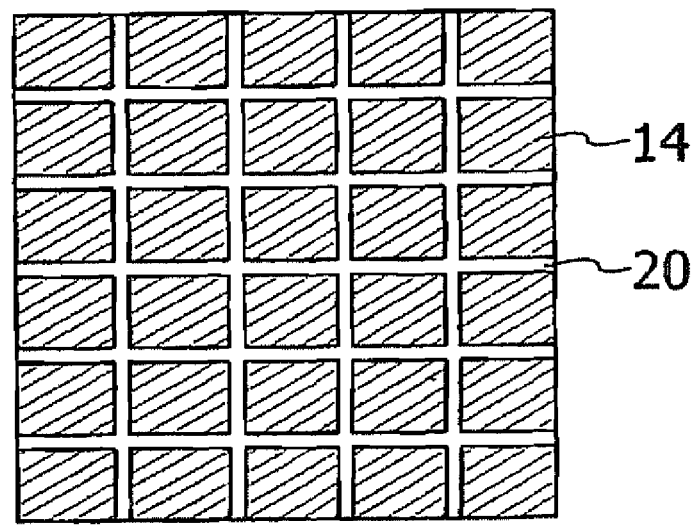

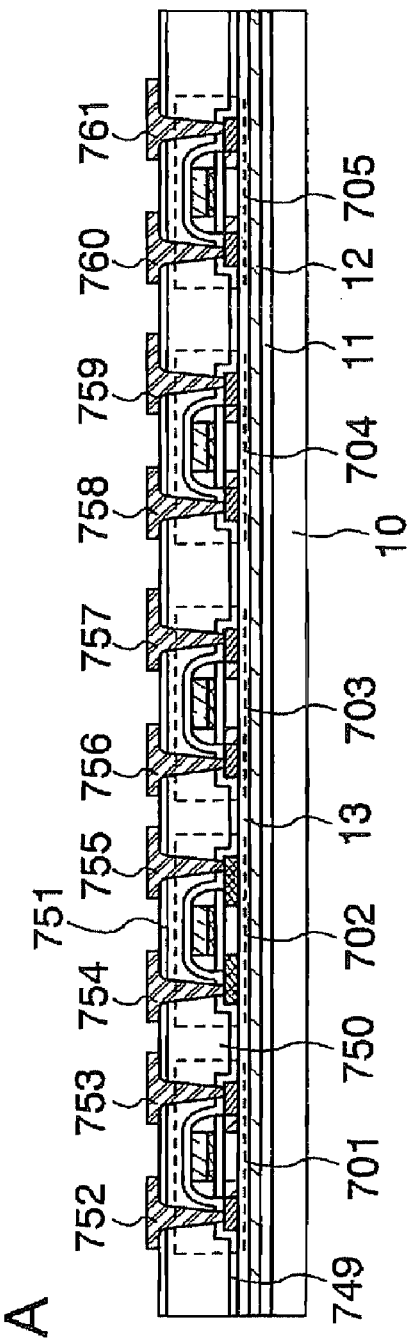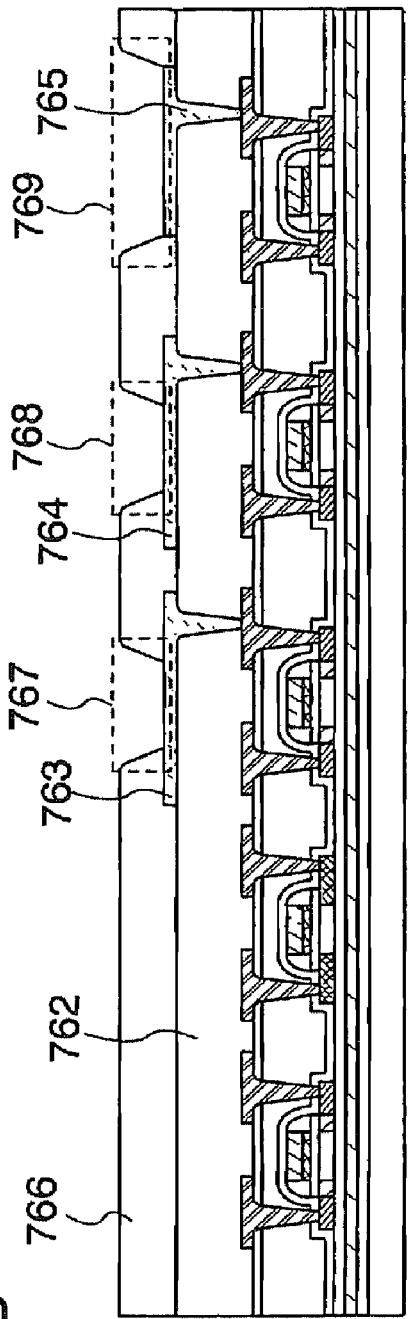

MANUFACTURING METHOD OF SEMICONDUCTOR DEVICE

TECHNICAL FIELD

The present invention relates to a manufacturing method of a semiconductor device.

BACKGROUND ART

In recent years, a semiconductor device which includes a thin film transistor provided over an insulating surface has been developed. In order to manufacture such a semiconductor device, there is a technique in which a release layer is formed over a substrate, a transistor is formed over the release layer, and the release layer is removed by using an etching agent such as halogen fluoride (for example, Reference 1: Japanese Patent No. 3406727).

DISCLOSURE OF INVENTION

Halogen fluoride used as an etching agent for removing a release layer, for example, chlorine trifluoride ($ClF_3$), is expensive. Accordingly, when such an etching agent is used, it is difficult to reduce manufacturing cost of a semiconductor device. In addition, a step of gradually removing a release layer with an etching agent requires several hours, which is one of the causes that produce low productivity of a semiconductor device.

In view of such problems, it is an object of the present invention to provide a manufacturing method of a semiconductor device with reduced manufacturing cost. It is another object of the present invention to provide a manufacturing method of a semiconductor device with reduced manufacturing time and improved productivity.

A manufacturing method of a semiconductor device of the invention includes the steps of forming a first layer over a substrate, forming a second layer so as to be in contact with the first layer, forming a third layer so as to be in contact with the second layer, forming a fourth layer including a thin film transistor so as to be in contact with the third layer, irradiating the second layer, the third layer, and the fourth layer with laser light (also referred to as laser beam) so as to form an opening portion which exposes at least the second layer, attaching a first film to a surface of the fourth layer, and separating the fourth layer from the substrate at a boundary inside the second layer or between the second layer and the third layer.

After the above-described steps, a step of attaching a surface of the second layer or the third layer to a second film is included. By this step, the second layer and the third layer are covered by the first film and the second film.

Note that in the case of separating the fourth layer from the substrate at the boundary inside the second layer, the second film is attached to the surface of the second layer. In addition, in the case of separating the fourth layer from the substrate at the boundary between the second layer and the third layer, the second film is attached to the surface of the third layer.

In the above-described manufacturing method of a semiconductor device, a layer containing oxide of silicon or nitride of silicon is formed as the first layer. As the second layer, a layer containing tungsten or molybdenum is formed. As the third layer, a layer containing oxide of silicon or nitride of silicon is formed. As the fourth layer, a thin film transistor and a conductive layer functioning as an antenna are formed.

Note that the step of forming the first layer may be omitted.

One feature of the invention is to form the opening portion so as to expose at least the second layer. In addition, after the exposed part of the second layer is formed, the exposed part serves as an origin, and a stack including the third layer and the fourth layer can be separated from the substrate on which the first layer is formed, at a boundary inside the second layer.

Note that formation of the opening portion so as to expose at least the second layer means that an opening portion, by which at least the third layer and the fourth layer are removed, is formed.

Another feature of the invention is to perform laser irradiation so as to form the opening portion which exposes the second layer. Thus, in the invention which uses laser irradiation, an opening portion can be formed without the need for a plurality of steps as in a photolithography method. Accordingly, manufacturing time can be reduced and yield can be drastically improved.

Still another feature of the invention is to form the thin film transistor and the conductive layer functioning as an antenna as the fourth layer. By the above-described characteristics, the semiconductor device manufactured in accordance with the invention has a function of transmitting and receiving electromagnetic waves.

According to the invention, a manufacturing method of a semiconductor device with reduced manufacturing cost can be provided. In addition, a manufacturing method of a semiconductor device with reduced manufacturing time and improved yield can be provided.

BRIEF DESCRIPTION OF DRAWINGS

In the accompanying drawings:

FIGS. 2A and 2B show a manufacturing method of a semiconductor device of the invention;

FIGS. 5A and 5B show a manufacturing method of a semiconductor device of the invention;

BEST MODE FOR CARRYING OUT THE INVENTION

Embodiment Mode

Figure 1A:
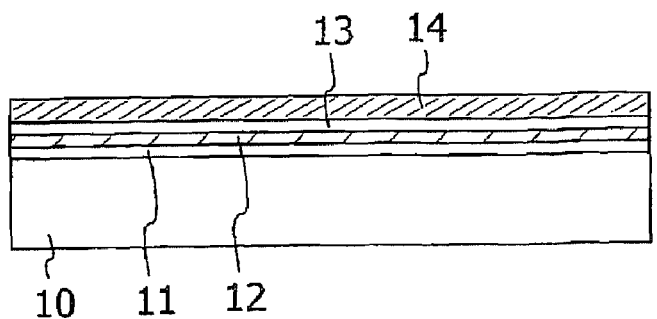
FIGS. 1A to 1E show a manufacturing method of a semiconductor device of the invention.

Embodiment modes and embodiments of the invention will be described in detail with reference to the drawings. Note that it is easily understood by those skilled in the art that the invention is not limited to the following descriptions, and various changes may be made in forms and details without departing from the spirit and the scope of the invention. Therefore, the invention should not be limited to descriptions of the embodiment modes and embodiments below. The same reference numerals are commonly given to the same components or components having the same function in the structures of the invention.

Embodiment Mode 1

Embodiment Mode 1 of the invention will be described with reference to sectional views of FIGS. 1A to 1E and top views of FIGS. 2A and 2B.

A first layer 11 is formed over a surface of a substrate 10 having an insulating surface (FIG. 1A). The substrate 10 corresponds to a silicon substrate, a glass substrate, a plastic substrate, a quartz substrate, or the like.

A glass substrate or a plastic substrate is preferably used because a glass substrate or a plastic substrate having a side of 1 meter or more or having a desired shape such as a quadrangle or circle can be easily manufactured. Thus, when a glass substrate or a plastic substrate having a side of 1 meter or more is used as the substrate 10 for example, productivity can be improved. This is a great advantage compared with the case of forming a semiconductor device using a silicon substrate having a circular shape.

The first layer 11 is formed by a plasma CVD method, a sputtering method, or the like by using oxide of silicon, nitride of silicon, oxide of silicon containing nitrogen, nitride of silicon containing oxygen, or the like. The first layer 11 prevents an impurity element in the substrate 10 from entering an upper layer. In addition, the first layer 11 can prevent the substrate 10 from being etched in a later step of laser irradiation.

It is to be noted that the step of forming the first layer 11 may be omitted. In addition, a second layer 12 may be formed over the surface of the substrate 10.

Next, the second layer 12 is formed so as to be in contact with the first layer 11. The second layer 12 is formed by a plasma CVD method, a sputtering method, or the like with a single layer or a stacked layer formed by using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir) or silicon (Si) or an alloy material or a compound material containing the above element as its main component. The crystal structure of the layer containing silicon may be any of the amorphous, microcrystalline or polycrystalline structure.

In the case where the second layer 12 has a single-layer structure, a tungsten layer, a molybdenum layer, or a layer containing a mixture of tungsten and molybdenum is formed preferably. Alternatively, a layer containing oxide, oxynitride, or nitride oxide of tungsten, a layer containing oxide, oxynitride, or nitride oxide of molybdenum, or a layer containing oxide, oxynitride, or nitride oxide of a mixture of tungsten and molybdenum may be formed. It is to be noted that the mixture of tungsten and molybdenum is an alloy of tungsten and molybdenum, for example.

In the case where the second layer 12 has a stack structure, a tungsten layer, a molybdenum layer, or a layer containing a mixture of tungsten and molybdenum is formed as a first layer. As a second layer, a layer containing oxide, nitride, oxynitride, or nitride oxide of tungsten, a layer containing oxide or oxynitride of molybdenum, or a layer containing oxide or oxynitride of a mixture of tungsten and molybdenum is formed.

Subsequently, a third layer 13 is formed so as to be in contact with the second layer 12. The third layer 13 is formed by a plasma CVD method, a sputtering method, or the like by using oxide of silicon, nitride of silicon, oxide of silicon containing nitrogen, nitride of silicon containing oxygen, or the like.

In the case where the second layer 12 has a stack structure of tungsten and oxide of tungsten, a layer containing tungsten is formed as the second layer 12, and a layer containing oxide of silicon is formed thereover as the third layer 13, so that a layer containing oxide of tungsten is formed at the interface between the layer containing tungsten and the layer containing oxide of silicon. This also applies to the case of forming a layer containing nitride, oxynitride or nitride oxide of tungsten or the like. In such a case, after a layer containing tungsten is formed, a layer containing nitride of silicon, a silicon nitride layer containing oxygen, or a silicon oxide layer containing nitrogen may be formed thereover.

Then, a fourth layer 14 including a transistor is formed so as to be in contact with the third layer 13 (FIG. 2A). For example, a plurality of thin film transistors, a first insulating film covering the plurality of thin film transistors, and source wires or drain wires which are in contact with the first insulating film and are connected to source electrodes or drain electrodes of the plurality of thin film transistors are formed. Subsequently, a fourth layer 14 which includes a second insulating film covering the source wires or the drain wires, a conductive layer which functions as an antenna and is in contact with the second insulting film, and a third insulating film covering the conductive layer functioning as an antenna is formed. In such a case, a completed semiconductor device has a function of transmitting and receiving electromagnetic waves.

In addition, differently from the above case, in the case of forming a semiconductor device having a function of storing data, a fourth layer including a memory element (a thin film transistor or the like) and a plurality of elements for controlling the memory element (a thin film transistor, a capacitor, a resistance element, or the like) is formed. Further in the case of forming a semiconductor device (for example, a CPU, a signal generation circuit, or the like) having a function of controlling a circuit or generating a signal or the like, a fourth layer 14 including a plurality of elements (a thin film transistor, a capacitor, a resistance element, or the like) is formed.

In the case of using a silicon substrate as the substrate 10, a fourth layer 14 including a field effect transistor or a thin film transistor which uses the silicon substrate as a channel portion is formed.

Figure 1B:
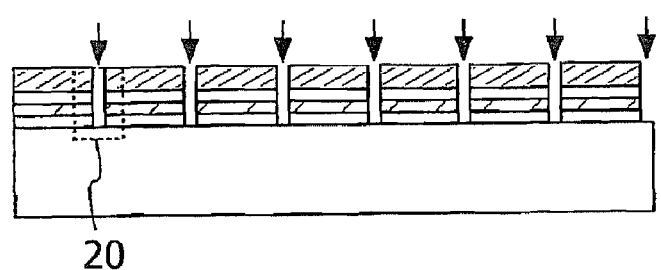

Then, an opening portion 20 is formed by laser irradiation so as to expose at least the second layer 12 (FIG. 1B and FIG. 2B). When an exposed part of the second layer 12 is made by forming the opening portion 20 in this manner, the exposed part serves as an origin, and a stack including the third layer 13 and the fourth layer 14 can be easily separated from the substrate 10 which is provided with the first layer 11. This separation occurs at a boundary inside the second layer 12 or between the second layer 12 and the third layer 13.

Figure 1C:
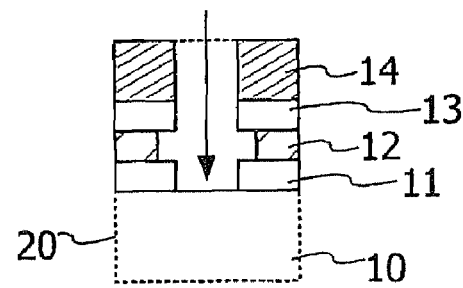

The second layer 12 may be removed partially so that the side surface recedes (FIG. 1C). Since such a recession of the second layer 12 depends on power of laser light, power of laser light may be appropriately controlled. In addition, the laser irradiation is performed for the purpose of exposing a surface of the second layer 12. Accordingly, although the first layer 11 is cut off by the laser irradiation in the above-described step, power of laser light may be controlled so as not to cut off the first layer 11.

At least the second layer 12 is exposed in the invention; however, the side surface of the second layer 12 may be partially removed by controlling power of laser light. Accordingly, a later separation step (separation of the stack including the third layer 13 and the fourth layer 14 from the substrate 10) can be conducted easily.

In other words, the opening portion 20 is formed by removing at least the third layer 13 and the fourth layer 14 in the invention. By forming the opening portion 20, a part of the second layer 12 is exposed.

A laser used in the invention is not particularly limited. A laser includes a laser medium, an excitation source, and a resonator. A laser can be classified by its medium into either a gas laser, a liquid laser, or a solid-state laser. In addition, the laser can be classified by its oscillation characteristics into either a free electron laser, a semiconductor laser, or an X-ray laser. In the invention, any laser may be used. Note that a gas laser or a solid-state laser is preferably used, and more preferably, a solid-state laser is used.

As examples of the gas laser, there are a helium-neon laser, a carbon dioxide gas laser, an excimer laser, and an argon ion laser. As the excimer laser, a rare gas excimer laser or a rare gas halide excimer laser can be used. Any of the three types of excited molecules, which are argon, krypton and xenon can be used for the rare gas excimer laser. As the argon ion laser, a rare gas ion laser or a metal vapor ion laser may be used.

As the liquid laser, there are an inorganic liquid laser, an organic chelate laser, and a dye laser. In the inorganic liquid laser and the organic chelate laser, a rare-earth ion of neodymium or the like which is utilized for a solid-state laser is used as a laser medium.

A laser medium used in a solid-state laser is formed by doping a solid-state parent substance with an active species. The solid-state parent substance is crystal or glass. The crystal refers to YAG (yttrium aluminum garnet crystal), YLF, $YVO_4$, $YAlO_3$, sapphire, ruby or alexandrite. In addition, the active species is, for example, a trivalent ion ($Cr^{3+}$, $Nd^{3+}$, $Yb^{3+}$, $Tm^{3+}$, $Ho^{3+}$, $Er^{3+}$ or $Ti^{3+}$).

Advantages of an $Nd:YVO_4$ laser are a large induction cross section, the excitation wavelength having high absorption coefficient and wide absorption bandwidth, excellent physical characteristics, optical characteristics and mechanical characteristics, and high output and high stability. Accordingly, it is preferable to use the $Nd:YVO_4$ laser.

For laser using ceramic (polycrystal) as a medium, a medium which can be formed into an arbitrary shape with a short time with low cost can be used. In a case of using a single-crystalline medium, a medium having a columnar shape with a diameter of several mm and a length of several tens of mm can usually be used. In the case of using ceramic (polycrystal) as a medium, the medium having a columnar shape larger than that of the single-crystalline medium can be formed.

The concentration of a dopant such as Nd or Yb in a medium which directly contributes to light emission cannot be changed much in either a single crystal or polycrystal. Accordingly, in the case of using a single-crystalline medium, there is a limitation of the output improvement of laser by increasing the concentration. However, in the case of using ceramic as a medium, the medium can be made significantly large compared to the single-crystal medium; accordingly, remarkable improvement of output can be expected.

In addition, in the case of using ceramic as a medium, a medium having a shape of a parallelepiped or a rectangular parallelepiped can be formed easily. By using a medium having such a shape and zigzagging oscillation light in the medium, oscillating light path can be lengthened. Accordingly, amplification is increased and oscillation with high output power can be performed.

Since a laser beam emitted from the medium having such a shape as described above has a cross section of a quadrangular shape when being emitted, formation into a linear beam is easier than the case of using a circular beam. Laser light emitted in such a manner is changed in shape by using an optical system; accordingly, a linear beam having a short side of 1 mm or less and a long side of several mm to several m can be obtained easily.

In addition, by uniformly irradiating the medium with exciting light, a linear beam has a uniform energy distribution in long side direction. By irradiating a semiconductor film with this linear beam, an entire surface of the semiconductor film can be annealed uniformly. In the case where a linear beam that is uniform across its width needs to be irradiated, both sides of the beam are provided with slits so as to intercept light of a portion where a linear beam is attenuated.

A continuous wave laser beam or a pulsed laser beam can be used as the laser beam used in the invention. In addition, irradiation condition of a laser beam, such as frequency, power density, energy density, or beam profile is appropriately controlled in consideration of the thicknesses, the materials, or the like of the first layer 11, the second layer 12, the third layer 13, and the fourth layer 14.

Figure 1D:
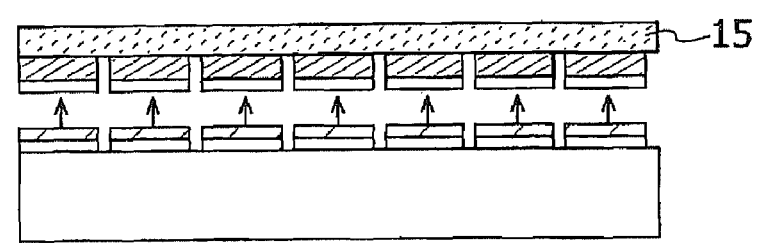

Next, a first film 15 (may be also referred to as a first substrate 15, a first base 15, a fifth layer 15, or a fifth layer containing a resin 15) is attached to a surface of the fourth layer 14, and the stack including the third layer 13 and the fourth layer 14 is separated from the substrate 10 provided with the first layer 11 at an inside of the second layer 12 or at a boundary between the second layer 12 and the third layer 13 (FIG. 1D). A roller may be used for such separation treatment. By rotating the roller, separation treatment can be continuously performed.

Figure 1E:
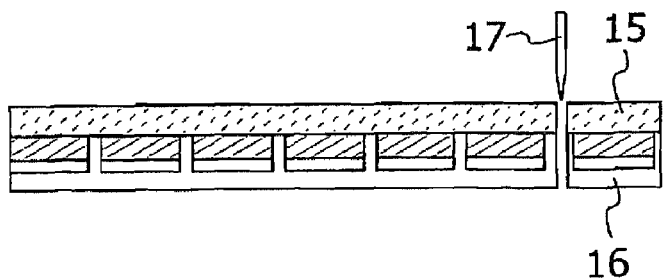

Subsequently, a second film 16 (may be also referred to as a second substrate 16 or a second base 16, a sixth layer 16, or a sixth layer containing a resin 16) is attached to a surface of the second layer 12 or the third layer 13 (FIG. 1E). In more detail, in the case where the stack including the third layer 13 and the fourth layer 14 is separated from the substrate 10 at the inside of the second layer 12, the second film 16 is attached to the surface of the second layer 12. In the case where the stack including the third layer 13 and the fourth layer 14 is separated at the boundary between the second layer 12 and the third layer 13, the second film 16 is attached to the surface of the third layer 13.

Through the above-described steps, the stack including the third layer 13 and the fourth layer 14 is sealed by the first film 15 and the second film 16. Subsequently, a portion where the first film 15 and the second film 16 are attached is cut off by cutting means 17. The cutting means 17 corresponds to a laser irradiation apparatus, a dicer, a wire saw, a knife, a cutter, scissors, or the like.

As each base material of the first film 15 and the second film 16, a material such as polypropylene, polyester, vinyl, polyvinyl fluoride, vinyl chloride, ethylene vinyl acetate, urethane, or polyethylene terephthalate or a fibrous material (for example, paper) can be used. A single film or a film in which a plurality of films is stacked may be used. In addition, an attachment layer may be provided on the surface. The attachment layer is a layer containing an adhesive agent such as thermosetting resin, ultraviolet curable resin, polyvinyl acetate resin-based adhesive, vinyl copolymer resin-based adhesive, epoxy resin-based adhesive, polyurethane resin-based adhesive, rubber-based adhesive, or acrylic resin-based adhesive.

Surfaces of the first film 15 and the second film 16 may be coated with powder of silicon dioxide (silica). By the coating, even when the first film 15 and the second film 16 are in an atmosphere with a high temperature and a high humidity, a waterproof property can be secured. In addition, the surfaces may be coated with a conductive material such as indium tin oxide. The material, with which the surfaces are coated, charges static electricity and a thin film integrated circuit can be protected from the static electricity. In addition, the surfaces may be coated with a material containing carbon as its main component (for example, diamond like carbon). By the coating, strength is improved, and deterioration and break of a semiconductor device can be suppressed. In addition, the first film 15 and the second film 16 may be formed with a material in which the above-described base material (for example, resin) and silicon dioxide, a conductive material, or a material containing carbon as its main component are mixed.

The stack including the third layer 13 and the fourth layer 14 is sealed by the first film 15 and the second film 16 by melting surface layers of the first film 15 and the second film 16 or the attachment layers on the surfaces of the first film 15 and the second film 16 by heat treatment. Further, pressure treatment is conducted for attachment, if necessary.

Depending on the case, the second film 16 is not necessarily provided. For example, the second film 16 does not need to be provided in the case where the stack including the third layer 13 and the fourth layer 14 is separated from the substrate 10 by using the first film 15 and then the stack is directly attached to an article.

According to the invention including the above-described manufacturing steps, cost can be reduced. For example, $ClF_3$ gas used as an etching agent is very expensive. However, since the invention does not need an etching agent, a manufacturing method of a semiconductor device with reduced cost can be provided.

Further, according to the invention, manufacturing time can be shortened, and productivity can be improved. For example, a step of removing a release layer by using an etching agent requires several hours conventionally. However, according to the invention, an exposed part of the second layer 12 can be easily formed by laser light, the exposed part serves as an origin, and separation can be easily conducted. The separation requires approximately several tens of seconds to several minutes. Accordingly, a manufacturing method of a semiconductor device with reduced manufacturing time and dramatically improved productivity can be provided.

Embodiment Mode 2

Embodiment Mode 2 will be described with reference to cross sections of FIGS. 3A to 3E and top views of FIGS. 4A to 4C.

Figure 3A:
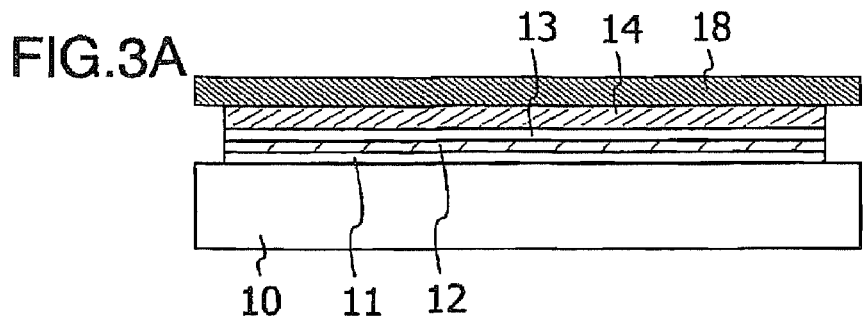
FIGS. 3A to 3E show a manufacturing method of a semiconductor device of the invention.
Figure 4A:
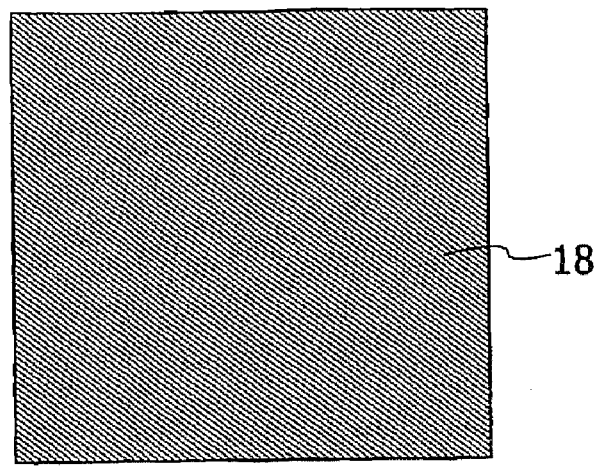
FIGS. 4A to 4C show a manufacturing method of a semiconductor device of the invention.
Figure 4B:
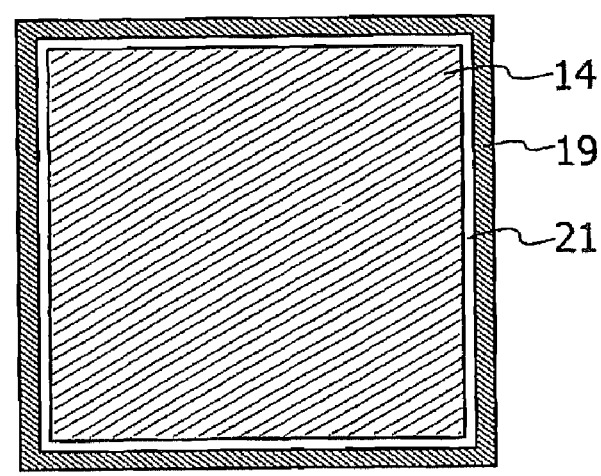

A first layer 11 is formed over a surface of a substrate 10 having an insulating surface (FIG. 3A and FIG. 4A). Next, a second layer 12 is formed so as to be in contact with the first layer 11. Then, a third layer 13 is formed so as to be in contact with the second layer 12. Subsequently, a fourth layer 14 including a thin film transistor is formed so as to be in contact with the third layer 13.

Figure 3B:
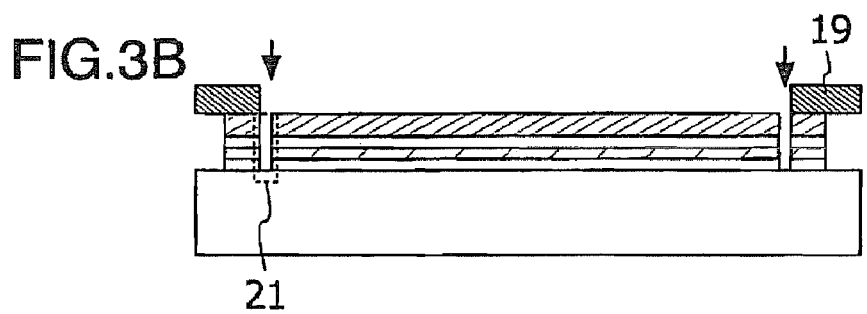

Next, a film 18 is disposed over the fourth layer 14. Subsequently, an opening portion 21 is formed by irradiating the film 18 with laser light so as to cut off the film 18. By forming the opening portion 21, the film 18 is separated into an inside film (not shown) and an outside film 19. Then, the inside film is removed (FIG. 3B and FIG. 4B).

Figure 3C:
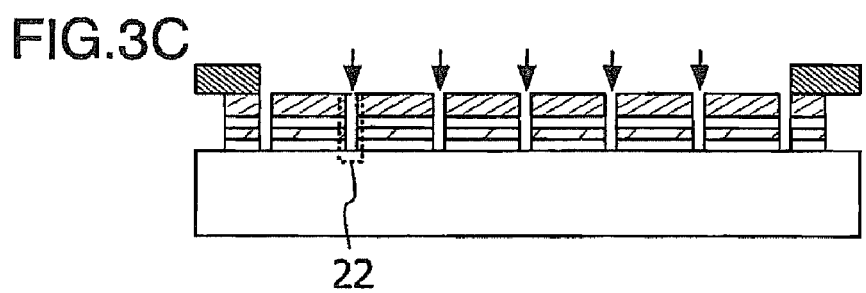
Figure 4C:
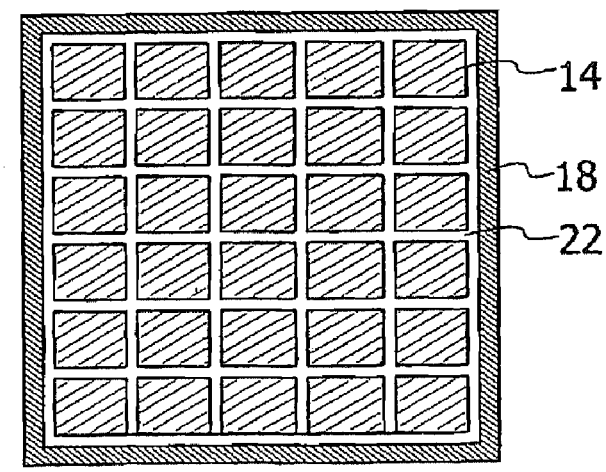

Next, an opening portion 22 is formed by laser irradiation so as to expose at least the second layer 12 (FIG. 3C and FIG. 4C).

Figure 3D:
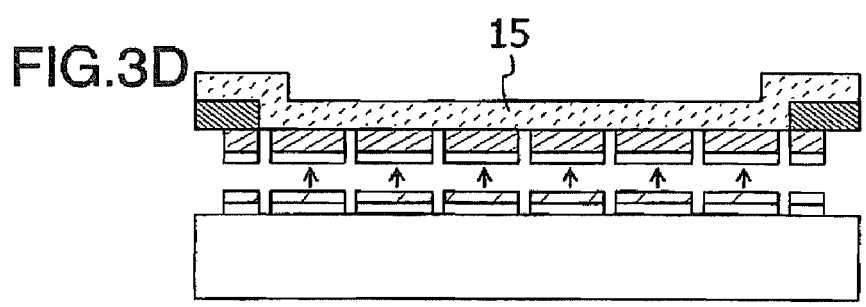

Then, a surface of the fourth layer 14 is attached to a first film 15, and a stack including the third layer 13 and the fourth layer 14 is separated from the substrate 10 provided with the first layer 11 at an inside of the second layer 12, at a boundary between the first layer 11 and the second layer 12, or at a boundary between the second layer 12 and the third layer 13 (FIG. 3D).

Figure 3E:
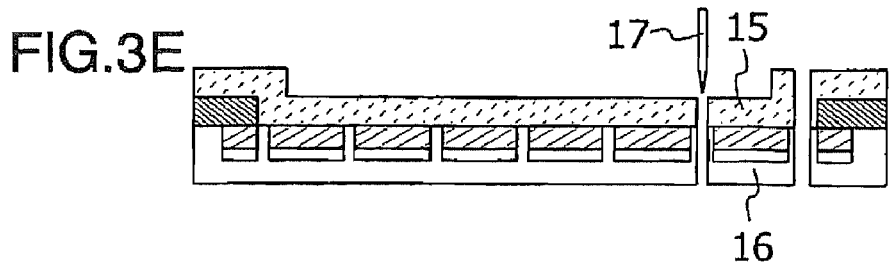

Subsequently, a second film 16 is attached to a surface of the third layer 13 (FIG. 3E). Then, a portion where the first film 15 and the second film 16 are attached is cut off by cutting means 17.

One feature of the above-described manufacturing method is to provide the film 18 over the fourth layer 14. By the above feature, when the surface of the fourth layer 14 is attached to the first film 15, the first film 15 can be prevented from attaching to the substrate 10.

Embodiment Mode 3

A manufacturing method of a semiconductor device of the invention will be described with reference to FIG. 5A to FIG. 8. Specifically, a manufacturing method of a semiconductor device including a thin film transistor and a conductive layer which functions as an antenna will be described with reference to the drawings. The thin film transistor is an element for constituting a part of a semiconductor device such as a power supply circuit, a demodulation circuit, or a modulation circuit.

A first layer 11 is formed over a surface of a substrate 10 (FIG. 5A). Then, a second layer 12 is formed so as to be in contact with the first layer 11. Subsequently, a third layer 13 is formed so as to be in contact with the second layer 12.

Next, thin film transistors 701 to 705 are formed over the third layer 13. The thin film transistors 701 to 705 are transistors each of which uses a crystalline semiconductor layer as a channel portion. The crystalline semiconductor layer is formed by forming amorphous semiconductor layer by a sputtering method, an LPCVD method, a plasma CVD method, or the like and crystallizing the amorphous semiconductor layers by a crystallization method. The crystallization method means a laser crystallization method, an RTA (Rapid Thermal Anneal) method, a thermal crystallization method using an annealing furnace, a thermal crystallization method using a metal element promoting crystallization, a method in which the thermal crystallization method using a metal element promoting crystallization and the laser crystallization method are combined, or the like.

Next, a single layer or a stacked layer of an insulating layer is formed to cover the thin film transistors 701 to 705. The insulating layer which covers the thin film transistors 701 to 705 is formed by an SOG (Spin On Glass) method, a droplet discharge method, or the like with a single layer or a stacked layer using oxide of silicon, nitride of silicon, polyimide, polyamide, benzocyclobutene, acrylic, epoxy, siloxane, or the like. The siloxane is a resin having an Si—O—Si bond. The siloxane has a skeletal structure formed from a bond of silicon (Si) and oxygen (O). As a substituent, an organic group containing at least hydrogen (for example, an alkyl group or aromatic hydrocarbon), a fluoro group, or an organic group containing at least hydrogen and a fluoro group may be used. For example, in the case where the insulating layer which covers the thin film transistors 701 to 705 has a three-layered structure, a layer containing silicon oxide is formed as a first insulating layer 749, a layer containing a resin is formed as a second insulating layer 750, and a layer containing silicon nitride is formed as a third insulating layer 751.

Then, the insulating layers 749 to 751 are etched by a photolithography method to form opening portions which expose source regions and drain regions of the thin film transistors 701 to 705. Subsequently, a conductive layer is formed so as to fill the opening portions, and the conductive layer is patterned to form conductive layers 752 to 761 which serve as a source wire or a drain wire.

Next, an insulating layer 762 is formed to cover the conductive layers 752 to 761 (FIG. 5B). The insulating layer 762 is formed with a single layer or a stacked layer of an inorganic material or an organic material by an SOG method, a droplet discharge method, or the like.

Subsequently, the insulating layer 762 is etched by a photolithography method to form opening portions which expose the conductive layers 757, 759, and 761. Next, a conductive layer is formed to fill the opening portions. The conductive layer is formed by a plasma CVD method, a sputtering method, or the like with a conductive material. Then, the conductive layer is patterned to form conductive layers 763 to 765.

Next, an insulating layer 766 is formed to cover the conductive layers 763 to 765. The insulating layer 766 is formed by an SOG method, a droplet discharge method, or the like with a single layer or a stacked layer using an inorganic material or an organic material. Subsequently, the insulating layer 766 is etched by a photolithography method to form opening portions 767 to 769 which expose the conductive layers 763 to 765.

Figure 6A:
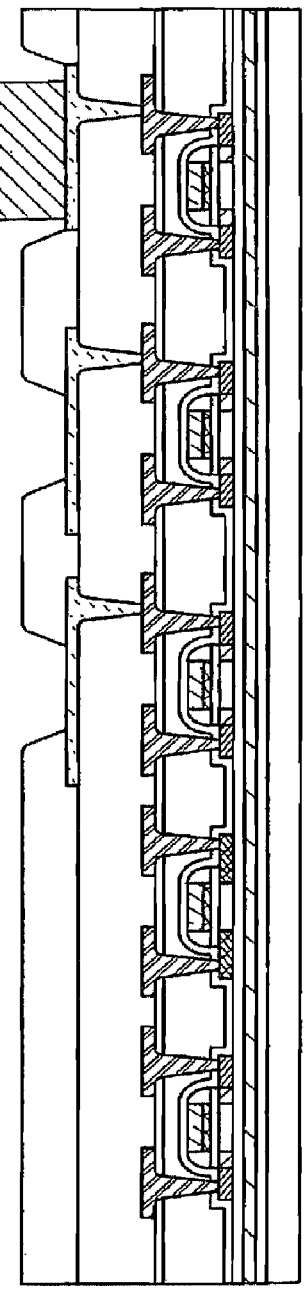
FIGS. 6A and 6B show a manufacturing method of a semiconductor device of the invention.

Subsequently, a conductive layer 786 functioning as an antenna is formed to be in contact with the conductive layer 765 (FIG. 6A). The conductive layer 786 is formed by a plasma CVD method, a sputtering method, a printing method, a droplet discharge method, a plating method, or the like with a conductive material. Preferably, the conductive layer 786 is formed with a single layer or a stacked layer using an element selected from aluminum (Al), titanium (Ti), silver (Ag) or copper (Cu), or an alloy material or a compound material containing the element as its main component. For example, a paste including particles of silver, aluminum, titanium or copper is deposited by a screen printing method and is subjected to heat treatment at a temperature of 50 to 350° C. Alternatively, an aluminum layer is formed by a sputtering method and the aluminum layer is patterned so as to form the conductive layer 786.

Figure 6B:
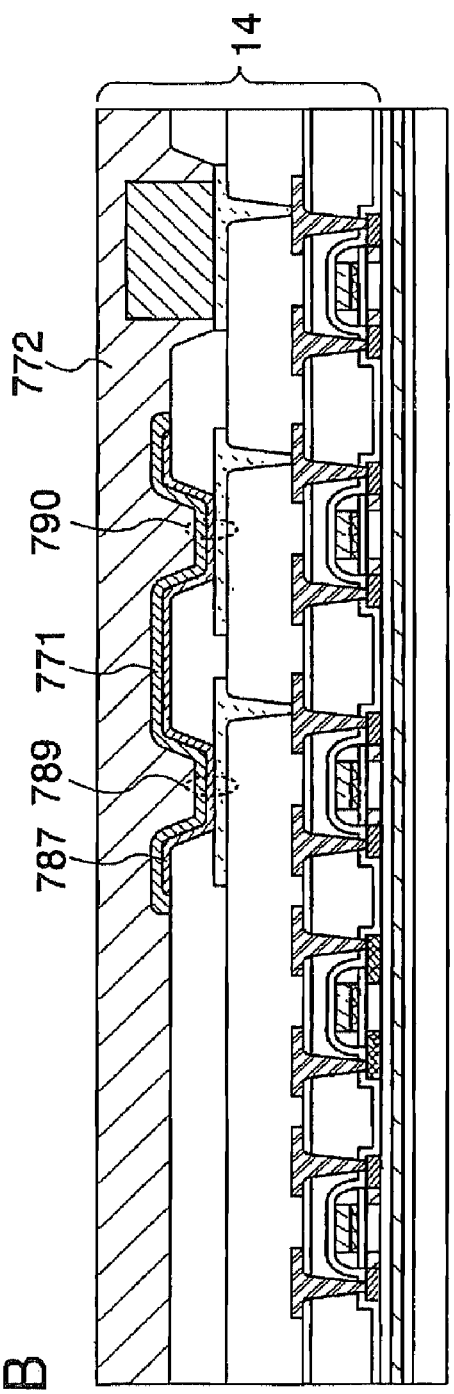

A layer containing an organic compound 787 is formed so as to be in contact with the conductive layers 763 and 764 (FIG. 6B). The layer containing an organic compound 787 is formed by a droplet discharge method, a vapor-deposition method, or the like. The layer containing an organic compound 787 is, for example, a layer containing a light emitting substance, a substance having a high hole transporting property, a substance having a high hole injecting property, a substance having a high electron transporting property, or a substance having a high electron injecting property. The light emitting substance corresponds to, for example, N,N'-dimethylquinacridone (abbreviation: DMQd), 3-(2-benzothiazolyl)-7-diethylaminocoumarin (abbreviation: coumarin 6), tris(8-quinolinolato)aluminum (abbreviation: Alq$_3$), or the like. The substance having a high hole transporting property corresponds to, for example, 4,4'-bis[N-(1-naphthyl)-N-phenyl amino]biphenyl (abbreviation: α-NPD), or N,N'-bis(3-methylphenyl)-N,N'-diphenyl-[1,1'-biphenyl]-4,4'-diamine (abbreviation: TPD). The substance having a high hole injecting property corresponds to phthalocyanine, copper phthalocyanine, molybdenum oxide, tungsten oxide, titanium oxide, or the like. The substance having a high electron transporting property corresponds to, for example, tris(8-quinolinolato) aluminum (abbreviation: Alq$_3$). The substance having a high electron injecting property corresponds to, for example, a compound or the like of an alkali metal or an alkaline earth metal, such as lithium fluoride (LiF), cesium fluoride (CsF), or calcium fluoride (CaF$_2$).

Subsequently, a conductive layer 771 is formed so as to be in contact with the layer 787 containing an organic compound. The conductive layer 771 is formed by a sputtering method, a vapor-deposition method, or the like.

Through the above-described steps, a stack 789 including the conductive layer 763, the layer 787 containing an organic compound, and the conductive layer 771, and a stack 790 including the conductive layer 764, the layer 787 containing an organic compound, and the conductive layer 771 are completed.

Next, an insulating layer 772 serving as a protective layer is formed by an SOG method, a droplet discharge method, or the like so as to cover the stacks 789 and 790 and the conductive layer 786 functioning as an antenna. The insulating layer 772 is formed of a layer containing carbon such as Diamond Like Carbon (DLC), a layer containing silicon nitride, a layer containing silicon nitride oxide, or an organic material (preferably, epoxy resin).

Through the above-described manufacturing steps, a fourth layer 14 which includes the thin film transistors 701 to 705, an element group including the stacks 789 and 790, and the conductive layer 786 functioning as an antenna is completed. One feature of the above-described manufacturing steps is to include the step of forming the layer 787 containing an organic compound after the step of forming the conductive layer 786 functioning as an antenna because the layer 787 containing an organic compound does not have high heat resistance.

Figure 7A:
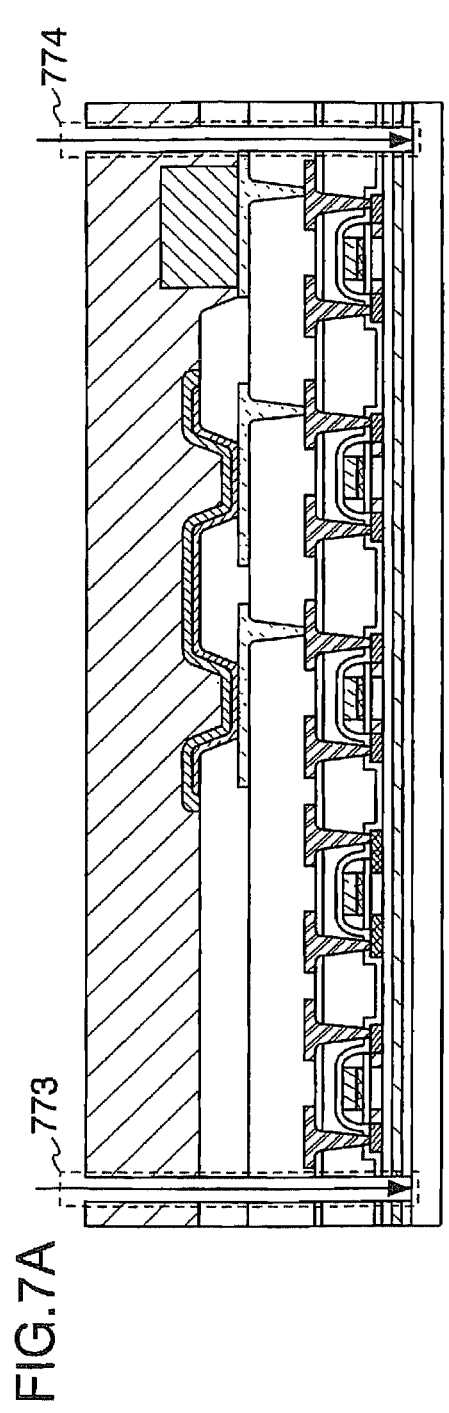
FIGS. 7A and 7B show a manufacturing method of a semiconductor device of the invention.

Subsequently, opening portions 773 and 774 are formed by laser irradiation, so as to expose at least the second layer 12 (FIG. 7A).

The insulating layer 772 is formed to prevent a stack including the third layer 13 and the fourth layer 14 from scattering, after the opening portions 773 and 774 exposing the second layer 12 are formed. After the opening portions 773 and 774 are formed, since the stack including the third layer 13 and the fourth layer 14 is thin and lightweight, it may easily scatter, serving the exposed part of the second layer 12 as an origin. However, by forming the insulating layer 772, the weight of the fourth layer 14 increases and thus the scattering from the substrate 10 can be prevented. The fourth layer 14 itself is thin and lightweight; however, by forming the insulating layer 772, the fourth layer 14 is not warped due to stress and can hold a certain degree of strength.

Figure 7B:
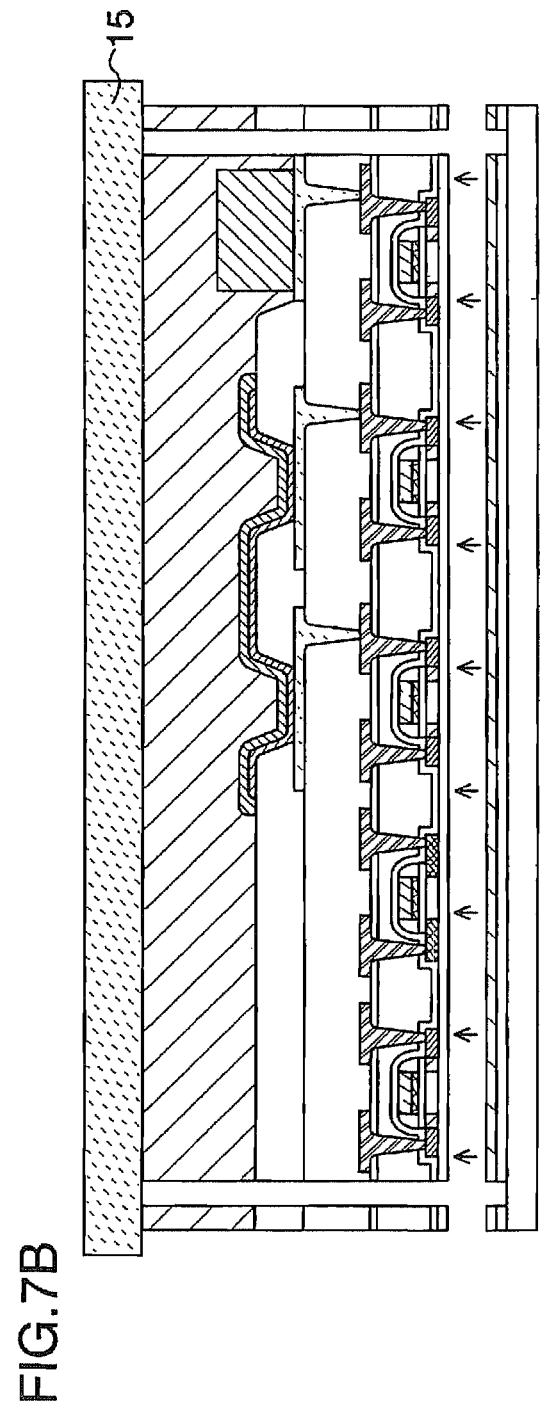
Figure 8:
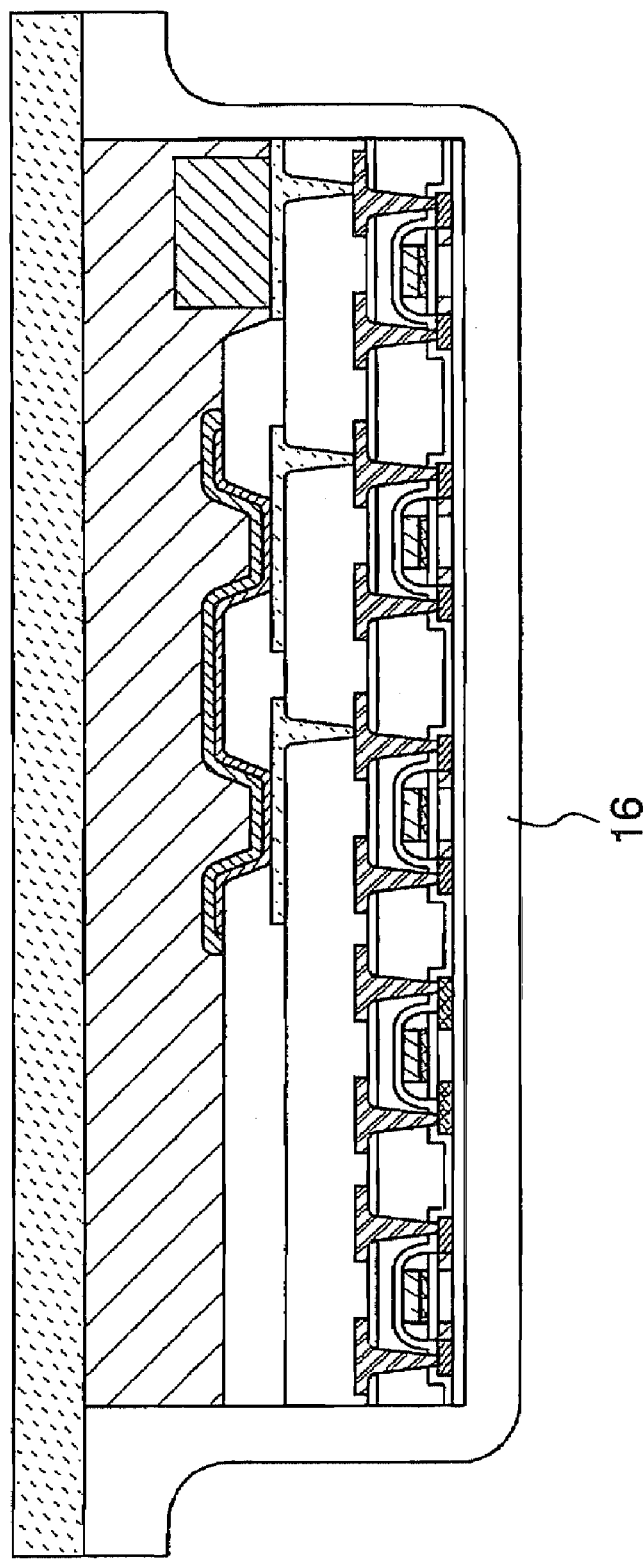
FIG. 8 shows a manufacturing method of a semiconductor device of the invention.

Next, a surface of the fourth layer 14 is attached to a first film 15, and the stack including the third layer 13 and the fourth layer 14 is completely separated from the substrate 10 (FIG. 7B). Subsequently, a second film 16 is attached to cover the third layer 13 and the fourth layer 14, and either or both of heat treatment and pressure treatment is performed to seal in the fourth layer 14 by the first film 15 and the second film 16 (FIG. 8).

If the first film 15 and the second film 16 are formed of plastic, since plastic is thin and lightweight and can be bent, processing into a flexible shape with good design can be easily conducted. In addition, since a plastic substrate has high impact resistance and can be easily attached to or embedded in various articles, it can be used in various fields.

In the aforementioned structure, the stacks 789 and 790 are elements provided with a layer containing an organic compound between a pair of conductive layers. In the case where the stacks 789 and 790 are used as memory elements, writing of data to the stacks 789 and 790 is conducted by short-circuiting the pair of conductive layers. Meanwhile, data is read from the stacks 789 and 790 by reading the difference of the resistance of them. Such stacks 789 and 790 have such features that they are nonvolatile, data thereof cannot be rewritten, and data can be added thereto as long as there is a memory element where data has not been written yet. Further, the stacks 789 and 790 can be easily manufactured since each of them has a three-layered structure. In addition, since the area of the stacked portion can be easily reduced, it is easy to achieve high integration. Note that each of the conductive layers 763 to 765 serves as one side conductive layer of the pair of conductive layers included in a memory element. Accordingly, the conductive layers 763 to 765 are preferably formed with a single layer or a stacked layer using titanium or an alloy material or a compound material containing titanium as it main component. Since titanium has low resistance value, the size of the memory element can be reduced and high integration can be achieved.

The stacks 789 and 790 may be used as light emitting elements. By using the stacks 789 and 790 as light emitting elements, the semiconductor device can be used as a display device. In addition, when the first film 15 and the second film 16 are flexible, there is an advantage that the semiconductor device is conveniently portable since it can be rolled, it is hardly broken, and curved display is possible. Accordingly, the semiconductor device can be used for a flexible display for a portable device, an electronic book, an electronic newspaper, an electronic poster, or the like.

In the case where the stacks 789 and 790 are used as light emitting elements, either of the conductive layers 763 and 764, or the conductive layer 771 is formed with a light-transmitting material.

In the above-described cross-section structure, the stacks 789 and 790 are formed to overlap with the thin film transistors 703 and 704, respectively. However, in the case where the stacks 789 and 790 are used as light emitting elements and light is emitted from the stacks 789 and 790 in a direction of the thin film transistors 703 and 704, a region where the stacks 789 and 790 do not overlap with the thin film transistors 703 and 704 is needed. In addition, in the case where light is emitted from the stacks 789 and 790 in a direction of the insulating layer 772, the insulating layer 772 needs to have light transmitting properties.

Embodiment 1

Figure 9:
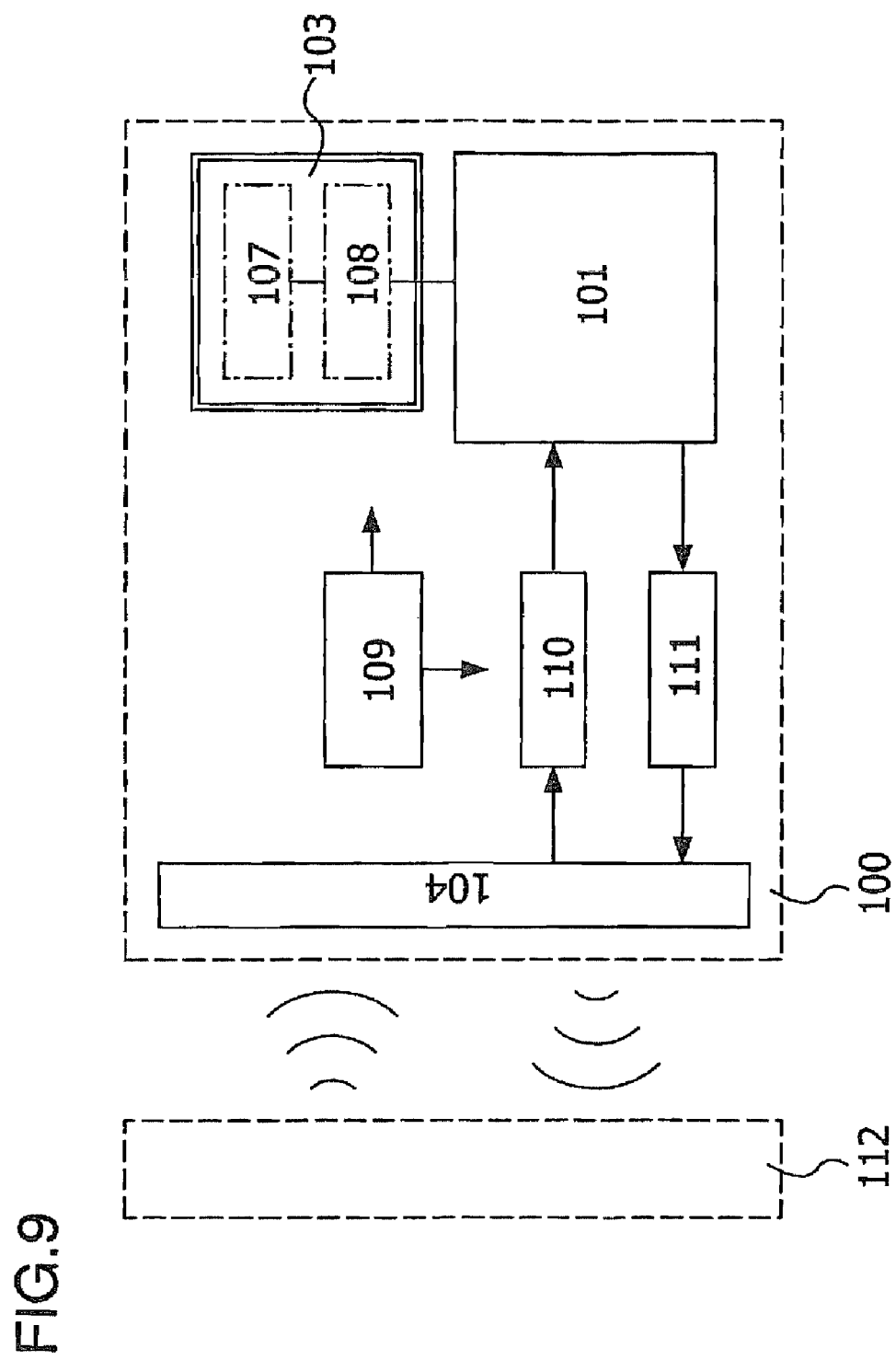
FIG. 9 shows a semiconductor device of the invention.

A structure of a semiconductor device of the invention will be described with reference to FIG. 9. A semiconductor device 100 of the invention includes a circuit 101 including an instruction decoder circuit and a memory control circuit, a memory circuit 103, an antenna 104, a power supply circuit 109, a demodulation circuit 110, and a modulation circuit 111. The semiconductor device 100 necessarily includes the antenna 104 and the power supply circuit 109. Other elements are provided as appropriate in accordance with the usage of the semiconductor device 100.

The circuit 101 including an instruction decoder circuit and a memory control circuit decodes the instruction, controls the memory circuit 103, outputs data to be transmitted to the outside into the modulation circuit 111, or the like, based on a signal input from the demodulation circuit 110.

The memory circuit 103 includes a circuit 107 including a memory element, and a control circuit 108 for controlling writing and reading of data. In the memory circuit 103, at least an identification number for the semiconductor device itself is stored. The identification number is used for distinguishing the semiconductor device from other semiconductor devices. In addition, the memory circuit 103 includes one kind or a plurality of kinds of memory selected from among an organic memory, a DRAM (Dynamic Random Access Memory), an SRAM (Static Random Access Memory), a FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), or a flash memory. An organic memory has a structure in which a layer containing an organic compound is interposed between a pair of conductive layers. Since an organic memory has a simple structure, manufacturing process can be simplified and cost can be reduced. In addition, due to the simple structure, an area of a stack can be easily reduced and high integration can be easily realized. Further, it is also an advantage that an organic memory is nonvolatile and does not require incorporation of a battery. Accordingly, an organic memory is preferably used as the memory circuit 103.

The antenna 104 converts a carrier wave provided from a reader/writer 112 into an alternating electrical signal. In addition, load modulation is applied from the modulation circuit 111. The power supply circuit 109 generates power voltage by using the alternating electrical signal converted by the antenna 104 and supplies power voltage to each circuit.

The demodulation circuit 110 demodulates the alternating electrical signal converted by the antenna 104 and supplies the demodulated signal into the circuit 101 including an instruction decoder circuit and a memory control circuit. The modulation circuit 111 applies load modulation to the antenna 104, based on the signal supplied from the circuit 101 including an instruction decoder circuit and a memory control circuit.

The reader/writer 112 receives the load modulation applied to the antenna 104 as a carrier wave. In addition, the reader/writer 112 transmits the carrier wave to the semiconductor device 100. Note that the carrier wave refers to an electromagnetic wave which is generated in the reader/writer 112.

A semiconductor device of the invention having a function of wirelessly transmitting and receiving an electromagnetic wave as described above is called an RFID (Radio Frequency IDentification), an RF chip, an RF tag, an IC chip, an IC tag, an IC label, a wireless chip, a wireless tag, an electronic chip, an electronic tag, a wireless processor, or a wireless memory. This embodiment can be freely combined with Embodiment Modes 1 to 3.

Embodiment 2

Figure 10A:
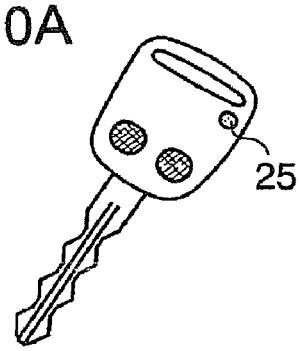
FIGS. 10A to 10D show articles which use a semiconductor device of the invention.
Figure 10B:
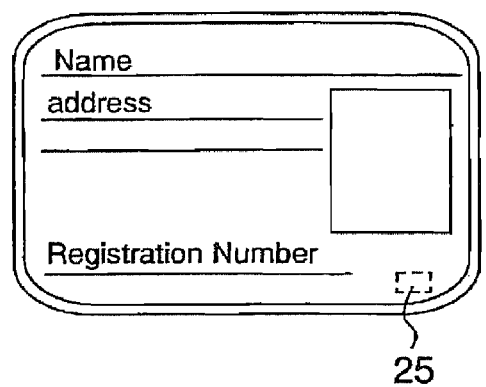
Figure 10C:
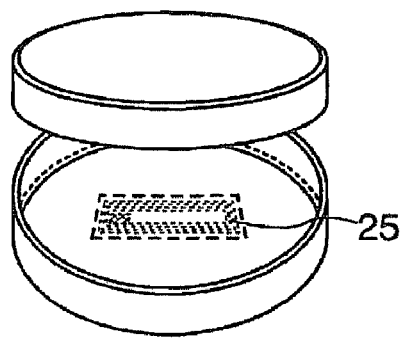
Figure 10D:
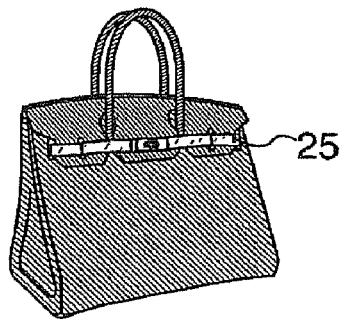

The semiconductor device 25 of the invention can be applied to a wide range of uses by utilizing its function of transmitting and receiving an electromagnetic wave. For example, the semiconductor device is attached to or embedded into an article such as a key (FIG. 10A), paper money, coins, securities, bearer bonds, certificates (a driver's license, a resident's card, or the like, FIG. 10B), books, containers (a petri dish or the like, FIG. 10C), wrapping containers (wrapping paper, bottles, or the like), recording media (a disk, a video tape, or the like), vehicles (a bicycle or the like), personal belongings (a bag, glasses, or the like, FIG. 10D), foods, clothing, commodities, or electronic devices (a liquid crystal display device, an EL display device, a television device, a portable terminal, or the like). In the case of paper money, coins, or certificates, the semiconductor device is attached to a surface thereof or embedded thereinto. In the case of books, the semiconductor device is attached to or embedded into the paper. In the case of containers, the semiconductor device attached to or embedded into an organic resin which forms the containers. Further, by storing an identification number in a memory circuit included in a semiconductor device and giving an identification function to the semiconductor device, the semiconductor device can be used in a product management system, an authentication system, a distribution system, or the like; accordingly, sophistication, multifunction, and high added value of the system can be obtained. This embodiment can be freely combined with Embodiment Modes 1 to 3 or Embodiment 1.

Embodiment 3

In Embodiment 3, an experimental result will be described. For the experiment, a sample in which a first layer, a second layer, and a third layer were stacked over a glass substrate was used. The first layer was a layer formed of silicon oxide by a plasma CVD method. The second layer was a layer formed of tungsten by a sputtering method. The third layer was a layer formed of epoxy resin.

Then, the sample was irradiated with Nd:YVO$_4$ laser with a wavelength of 266 nm to form an opening portion which exposed the substrate. At this time, the scanning speed of the laser light was set at 15 mm/sec, and the power was set at 2.43 to 2.68 W.

Next, an attempt was made to attach the third layer to a film and separate the third layer from the substrate. The result was that the third layer was able to be separated from the substrate. Side surfaces of the first layer, the second layer, and the third layer were exposed by the formation of the opening portion. Among them, the side surfaces of the second layer had receded more than the side surfaces of the first layer and the third layer (FIG. 1C).

Embodiment 4

In Embodiment Mode 1, the step of forming the opening portion 20 by laser irradiation so as to expose at least the second layer 12 (hereinafter referred to as Step A, FIG. 1B), the step of attaching the first film 15 to the surface of the fourth layer 14 (hereinafter referred to as Step B, FIG. 1D), and the step of separating the stack including the third layer 13 and the fourth layer 14 from the substrate 10 by using the first film 15 (hereinafter referred to as Step C, FIG. 1D) are described. Hereinafter, Steps A, B and C are described in more detail with reference to FIGS. 11A to 11C.

Figure 11A:
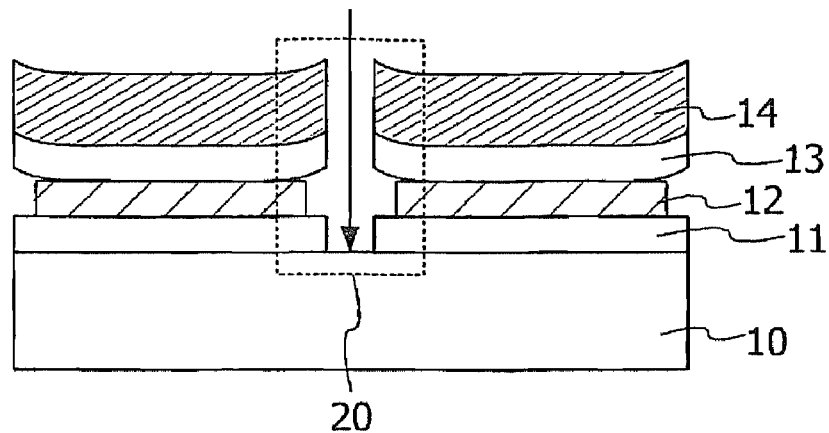
FIGS. 11A to 11C show a manufacturing method of a semiconductor device of the invention.

First, the opening portion 20 is formed by laser irradiation so as to expose at least the second layer 12 (FIG. 11A). When the opening portion 20 is formed, a warp is generated in one or both end portions of the fourth layer 14 and the third layer 13. By the generation of the warp, one or both end portions of the fourth layer 14 and the third layer 13 are lifted upward. In other words, a state is obtained, in which one or both end portions of the fourth layer 14 and the third layer 13 are rolled. A direction in which the warp is generated is the same as a direction in which separation in the later step is conducted. Accordingly, by the generation of the warp, later separation can be easily performed. Thus, the thickness of one or both of the fourth layer 14 and the third layer 13 is preferably set at a thickness so as to generate a warp in one or both of the fourth layer 14 and the third layer 13. Note that the generation of the warp is due to stress. In addition, a material containing resin may be used for the fourth layer 14 so as to generate the warp.

Figure 11B:
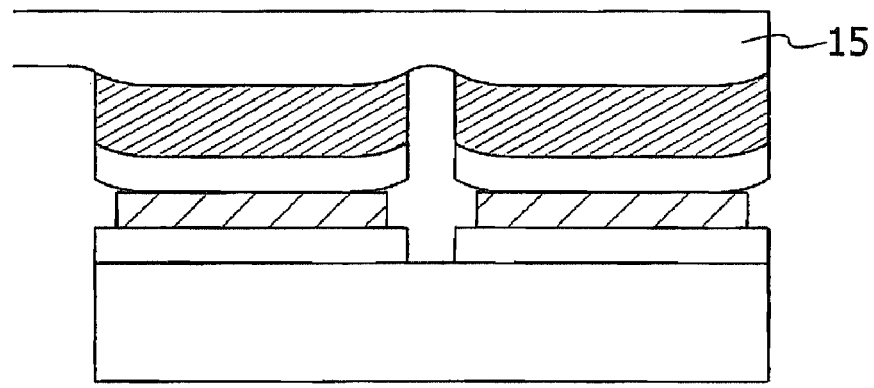

Next, the first film 15 is attached to the surface of the fourth layer 14 (FIG. 11B).

Figure 11C:
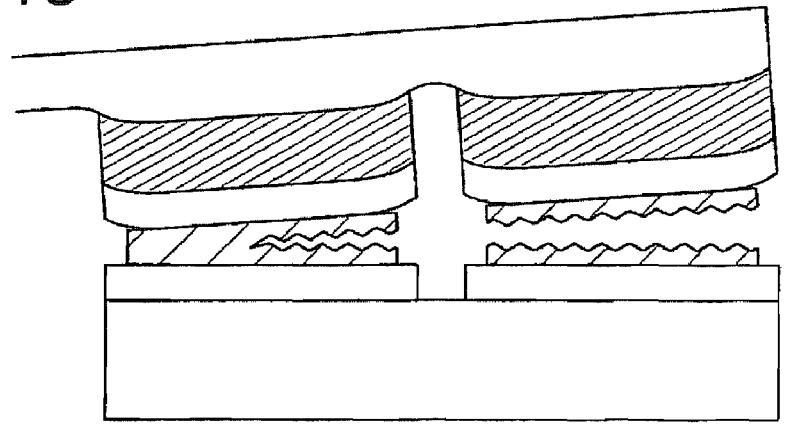

Then, the stack including the third layer 13 and the fourth layer 14 is separated from the substrate 10 by using the first film 15 (FIG. 11C). The separation is conducted at an inside of the second layer 12 or/and at a boundary between the second layer 12 and the third layer 13. The separation proceeds in order from the opening portion 20. In other words, the opening portion 20 serves as an origin and the separation proceeds in order.

Embodiment 5

Figure 12:
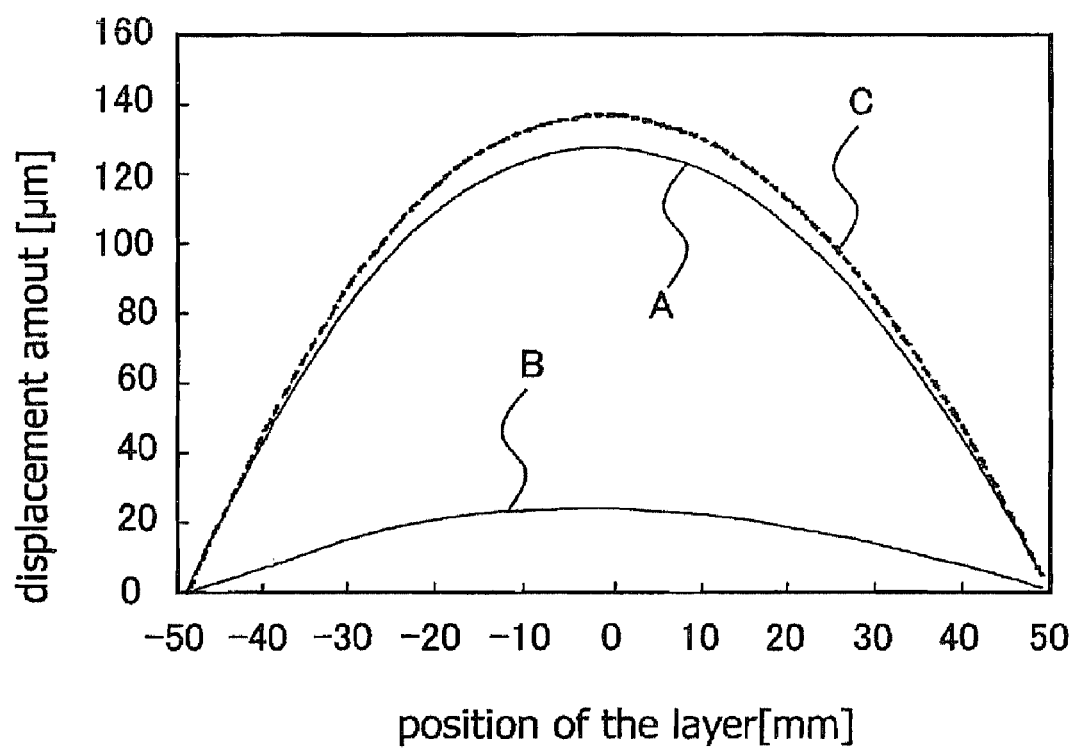
FIG. 12 shows an experimental result.

Embodiment 5 describes a relation between the displacement amount of a warp (deflection) of a layer containing an organic resin over a substrate (μm, a vertical axis) and the position of the layer (mm, a horizontal axis), with reference to FIG. 12. First, three samples (samples A, B and C) in each of which a layer containing an organic resin was formed with a thickness of 30 nm over a glass substrate were formed. The layer containing an organic resin was formed by a screen printing method using epoxy resin.

Subsequently, the sample A was subjected to heat treatment at 110° C. for 10 minutes by using a heating furnace. The sample B was subjected to heat treatment at 110° C. for 10 minutes by using a heating furnace and then left in water for 4 hours. The sample C was subjected to heat treatment at 110° C. for 10 minutes by using a heating furnace, left in water for 4 hours, and then subjected to heat treatment at 110° C. for 10 minutes by using a heating furnace.

Then, the displacement amounts of warps of epoxy resin in the samples A, B and C were measured with a laser displacement sensor. The results were that a warp of a maximum of 120 μm was generated in the sample A. In the sample B, a warp of a maximum of 20 μm was generated. In the sample C, a warp of a maximum of 130 μm was generated.

From the result of the sample A, it was found that a warp is generated in a layer containing epoxy resin by performing heat treatment. Such a warp helps the later separation treatment to be performed easily.

In addition, from the result of the sample B, it was found that, when the sample is left in water, the layer containing epoxy resin absorbs moisture and the displacement amount of the warp is decreased. Therefore, it was also found that in the case where the layer containing epoxy resin absorbs moisture, it becomes hard to perform the subsequent separation treatment easily.

Further, from the result of the sample C, it was found that when the sample is left in the water and then subjected to heat treatment again, the absorbed moisture is released and a warp is generated again. Therefore, in the case where the layer containing an organic resin absorbs moisture, it is preferable to perform separation treatment after conducting heat treatment again.

This application is based on Japanese Patent Application serial no. 2005-148405 filed in Japan Patent Office on May 20, 2005, the entire contents of which are hereby incorporated by reference.

What is claimed is:

1. A manufacturing method of a semiconductor device, comprising the steps of:
   forming a first layer containing a metal over a first substrate;
   forming a second layer containing an inorganic material on the first layer;
   forming a third layer including a thin film transistor on the second layer;

irradiating the first layer, the second layer, and the third layer with laser light to form an opening portion through at least the second layer and the third layer;

attaching a second substrate over the third layer; and separating at least the third layer from the first substrate, wherein the semiconductor device includes a part of the second substrate.

2. The manufacturing method of a semiconductor device according to claim 1, wherein the third layer is separated from the first substrate in the first layer.

3. The manufacturing method of a semiconductor device according to claim 1, wherein the third layer is separated from the first substrate at a boundary between the first layer and the second layer.

4. The manufacturing method of a semiconductor device according to claim 1, wherein tungsten or molybdenum is formed as the metal, an oxide of silicon or a nitride of silicon is formed as the inorganic material, and the thin film transistor and a conductive layer functioning as an antenna are formed as the third layer.

5. A manufacturing method of a semiconductor device, comprising the steps of:
    forming a first layer containing a first inorganic material over a substrate;
    forming a second layer containing a metal on the first layer;
    forming a third layer containing a second inorganic material on the second layer;
    forming a fourth layer including a thin film transistor on the third layer;
    irradiating the first layer, the second layer, the third layer, and the fourth layer with laser light to form an opening portion through at least the third layer and the fourth layer; and
    separating at least the fourth layer from the substrate.

6. The manufacturing method of a semiconductor device according to claim 5, wherein the fourth layer is separated from the substrate in the second layer.

7. The manufacturing method of a semiconductor device according to claim 5, wherein the fourth layer is separated from the substrate at a boundary between the second layer and the third layer.

8. The manufacturing method of a semiconductor device according to claim 5, wherein a first oxide of silicon or a first nitride of silicon is formed as the first inorganic material, tungsten or molybdenum is formed as the metal, a second oxide of silicon or a second nitride of silicon is formed as the second inorganic material, and the thin film transistor and a conductive layer functioning as an antenna are formed as the fourth layer.

9. A manufacturing method of a semiconductor device, comprising the steps of:
    forming a first layer containing a metal over a substrate;
    forming a second layer containing an inorganic material on the first layer;
    forming a third layer including a thin film transistor on the second layer;
    irradiating the first layer, the second layer, and the third layer with laser light to form a plurality of opening portions through at least the second layer and the third layer; and
    separating at least the third layer from the substrate.

10. The manufacturing method of a semiconductor device according to claim 9, wherein the third layer is separated from the substrate in the first layer.

11. The manufacturing method of a semiconductor device according to claim 9, wherein the third layer is separated from the substrate at a boundary between the first layer and the second layer.

* * * * *